United States Patent [19]
Brunelle

[11] Patent Number: 5,982,495
[45] Date of Patent: Nov. 9, 1999

[54] OBJECT COUNTING METHOD AND APPARATUS

[75] Inventor: Steven J. Brunelle, Boise, Id.

[73] Assignee: Micron Electronics, Inc., Nampa, Id.

[21] Appl. No.: 09/009,916

[22] Filed: Jan. 21, 1998

[51] Int. Cl.[6] .................................................. G01B 11/04
[52] U.S. Cl. ............................................................ 356/376
[58] Field of Search .................................. 356/376, 73.1, 356/39

[56] References Cited

U.S. PATENT DOCUMENTS

| | | |
|---|---|---|
| 3,808,692 | 5/1974 | Gartner ........................................ 33/140 |
| 3,813,523 | 5/1974 | Mohan et al. ............................. 235/92 |
| 4,217,491 | 8/1980 | Dufford, Jr. et al. . |
| 4,384,195 | 5/1983 | Nosler . |
| 4,481,667 | 11/1984 | Price et al. . |
| 4,807,263 | 2/1989 | Ohno et al. . |
| 5,032,715 | 7/1991 | DeLise . |
| 5,041,721 | 8/1991 | Smith et al. . |

Primary Examiner—Frank G. Font
Assistant Examiner—Tu T. Nguyen
Attorney, Agent, or Firm—Dorsey & Whitney LLP

[57] ABSTRACT

The present invention provides a method and apparatus for automatically counting objects, e.g., chips, that are arranged in a linear object sequence. The object sequence has a length that is proportional to the number of objects in the object sequence. In one embodiment of the counting method, the length of the object sequence is measured. The number of objects in the sequence are then determined from the measured length of the object sequence and the known length of a chip. In one embodiment of a counting apparatus, the apparatus has a scan station, a distance sensor, and a processor. The scan station has a scan zone that receives a plurality of object sequences. The distance sensor is operably aligned with the scan zone for measuring the length of each object sequence. The processor is communicatively connected to the distance sensor to determine and calculate the number of objects within the plurality of object sequences from the measured length of each object sequence.

32 Claims, 7 Drawing Sheets

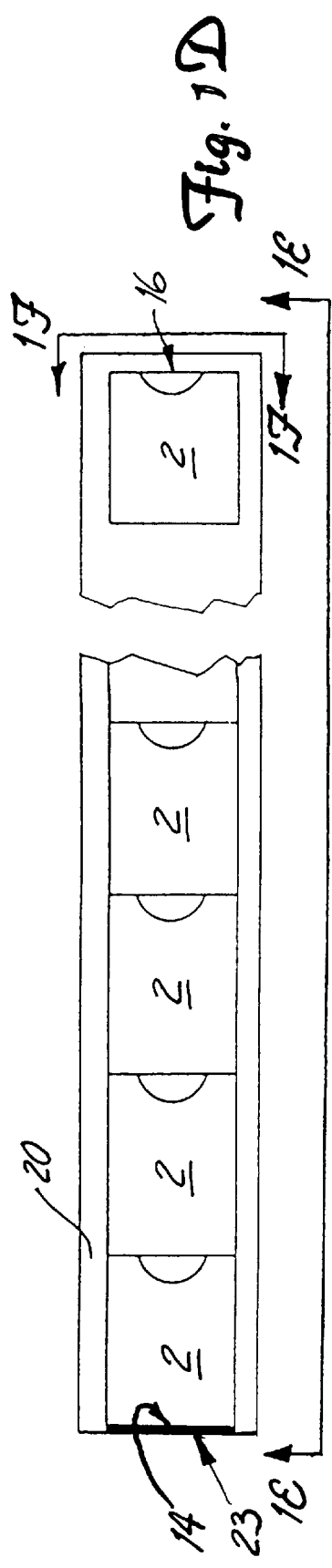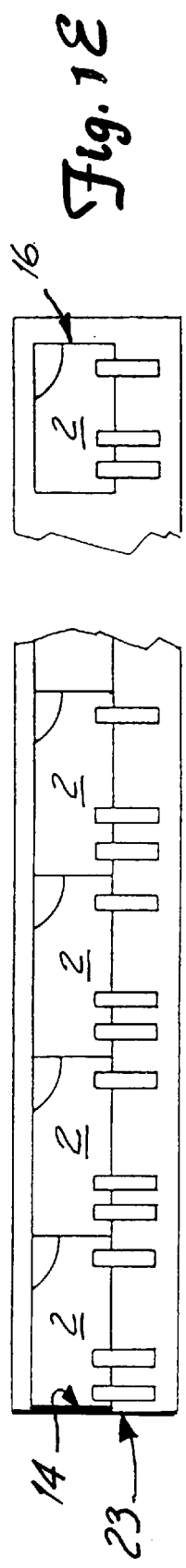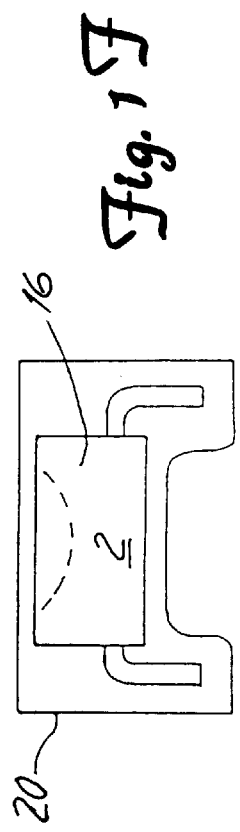

OBJECT COUNTING METHOD AND APPARATUS

This application is related to and hereby incorporates by reference the application titled [OBJECT COUNTING METHOD] [OBJECT COUNTING APPARATUS], filed on the same date herewith.

TECHNICAL FIELD

The present invention relates generally to object counting. In particular, the present invention relates to a scheme for automatically counting objects that are positioned in an object sequence.

BACKGROUND OF THE INVENTION

In the semiconductor industry, integrated circuit chips ("IC chips") are commonly transported within a manufacturing facility or shipped to customers in elongated, linear shipping tubes. The IC chips are typically positioned within the shipping tubes in a stacked or end-to-end linear configuration such that the front end of one IC chip abuts the back end of the next IC chip within the shipping tube ("chip sequence").

During various stages of the IC chip manufacturing process, it is desirable or even necessary to count the number of IC chips in a shipping tube (or a bundle of shipping tubes) prior to transporting the shipping tube(s) on to the next stage within the process or on to the customer. The customer may also desire to count the number of IC chips in a shipping tube that it receives or one that is being used in manufacturing. One method for counting IC chips within a shipping tube is to remove and manually count the IC chips. The manual counting process is, however, slow and subject to error. In addition, the chips are subjected to unnecessary handling. Another similar method is to visually count the IC chips within the shipping tube(s) (which may be constructed from a transparent or substantially transparent material). This method is also slow and generally subject to more error than the manual counting process.

Thus, there exists a need for an efficient scheme for counting IC chips within a chip sequence or bundle of chip sequences without having to remove the chips from the sequence.

SUMMARY OF THE INVENTION

The present invention provides a method and apparatus for automatically counting objects, e.g., chips, that are arranged in an object sequence. The object sequence also has a length that is proportional to the number of objects in the object sequence. In one embodiment of a counting method, the length of the object sequence is measured. The number of objects in the sequence is then determined from the measured length of the object sequence and the known length of each chip or other object.

In an embodiment of an object counting apparatus, the apparatus has a scan station, a distance sensor, and a processor. The scan station has a scan zone that receives the at least one object sequence.

The distance sensor is operably oriented relative to the scan zone for measuring the length of the at least one object sequence. A processor is communicatively connected to the distance sensor to determine the number of objects within the at least one object sequence from the known object size and the measured length of the at least one object sequence.

BRIEF DESCRIPTION OF THE DRAWINGS

FIG. 1D is a top view of a shipping tube containing a chip sequence.
FIG. 1E is a side view of the shipping tube of FIG. 1D taken along line 1E—1E.
FIG. 1F is an end view of the shipping tube of FIG. 1C taken along line 1F—1F.

DETAILED DESCRIPTION

5.1 Chips and Chip Sequences

Figure 1A:
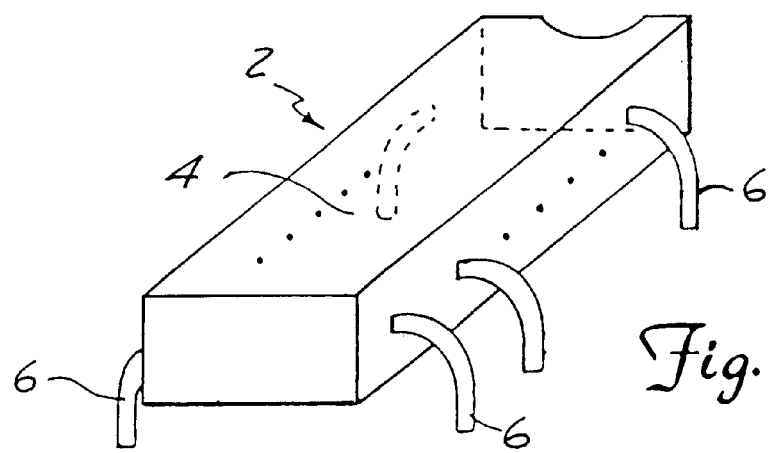
FIG. 1A is a perspective view of an exemplary IC chip.
Figure 1B:
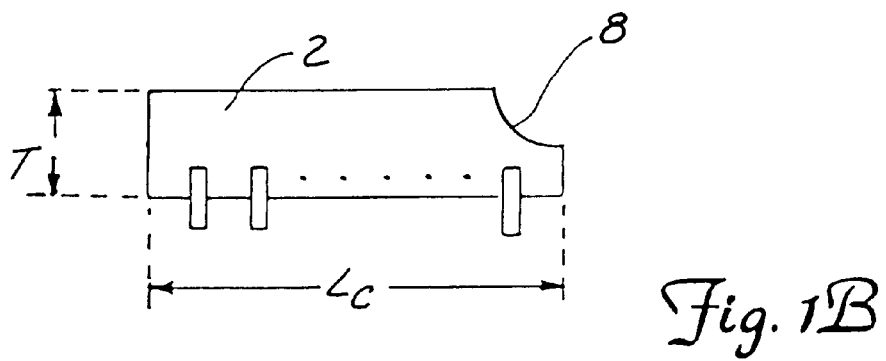
FIG. 1B is a side view of the chip of FIG. 1A.
Figure 1C:
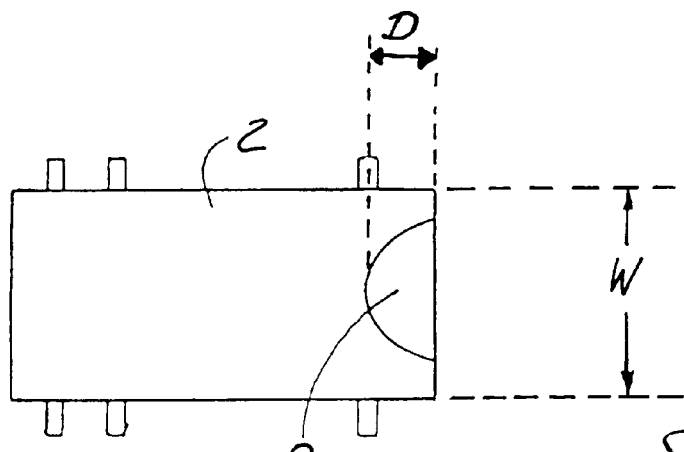
FIG. 1C is a top view of the chip of FIGS. 1A and 1B.

Referring to FIGS. 1A–1C, there is shown a typical IC chip 2. The IC chip 2 generally comprises a body 4 and a plurality of legs 6 mounted to the body 4. The IC chip 2 also has a recessed portion 8 at an end of its body 4. The recessed portion 8 has a maximum depth D relative to the end of body 4. The IC chip 2 has dimensions that correspond to the dimensions of its body 4. Thus, IC chip 2 has a length $L_C$, a width W, and a thickness T.

Referring to FIGS. 1D–1F, there is shown a chip sequence 12 housed in a linear shipping tube 20. As shown in the figures, shipping tube 20 may be formed from a transparent or substantially transparent plastic. In addition, shipping tube 20 may be elongated to store relatively long chip sequences 12 and have a cross-sectional shape that is designed to substantially conform to the dimensions and shape of a typical IC chip 2. One end of the tube may be closed by a wall 23 (or alternatively a thin end plug (not shown)).

A chip sequence 12 generally comprises a plurality of IC chips 2; however, it may only include a single chip 2. The chip sequence 12 has a first end 14, a second end 16, and a length $L_S$, which is the distance between the first end 14 and the second end 16 and (assuming closely adjacent chips) is proportional to the number of chips 2 within the chip sequence 12. In addition, as shown in FIGS. 1D and 1E, the IC chips 2 of a chip sequence 12 are generally sequentially arranged with their ends abutting one another. As shown in FIG. 1F, the second end 16 of chip sequence 12 may be proximate to an open or transparent end of shipping tube 20. As will be appreciated later, this open or transparent end may provide a distance sensor with access to the second end 16 of chip sequence 12.

Figure 2:
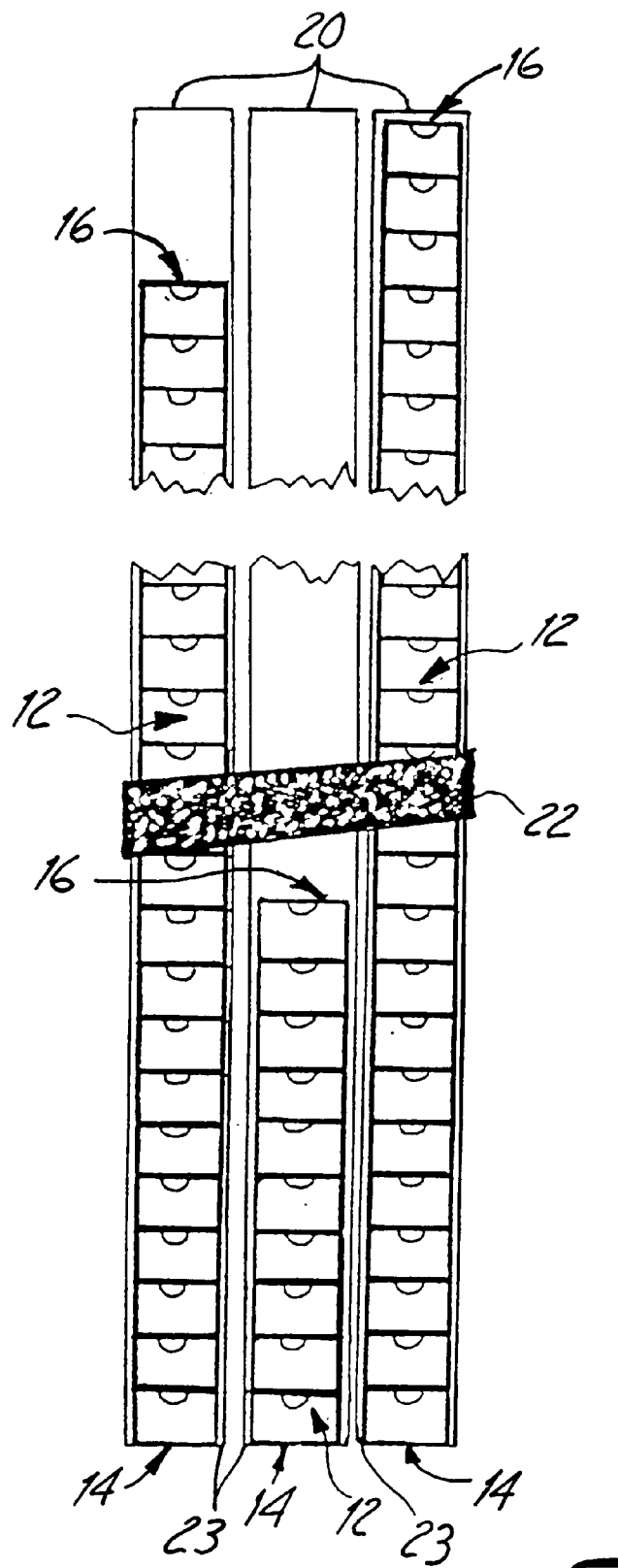
FIG. 2 shows a bundle of shipping tubes with a plurality of chip sequences.

FIG. 2 shows a shipping tube bundle 21 that includes a plurality of linear shipping tubes 20 bounded by bundle band 22. Each shipping tube 20 includes a linear chip sequence 12. As shown in FIG. 2, chip sequences 12 are substantially parallel with one another, making their lengths amenable for measuring in a manner consistent with embodiments of the present invention. In addition, as depicted in FIG. 2, chip sequences 12 may be vertically aligned. Through gravitational force, such vertical alignment encourages the chips 2 within each chip sequence 12 to abut each other and the bottom chip to rest on the bottom end wall 23 of tube 20. In this manner, possible gaps are prevented from forming between chips 2. This gap reduction improves the accuracy in calculating the number of chips 2 in a chip sequence 12 from the length $L_S$ of the chip sequence 12.

5.2 Chip Counting Apparatus

Figure 3:
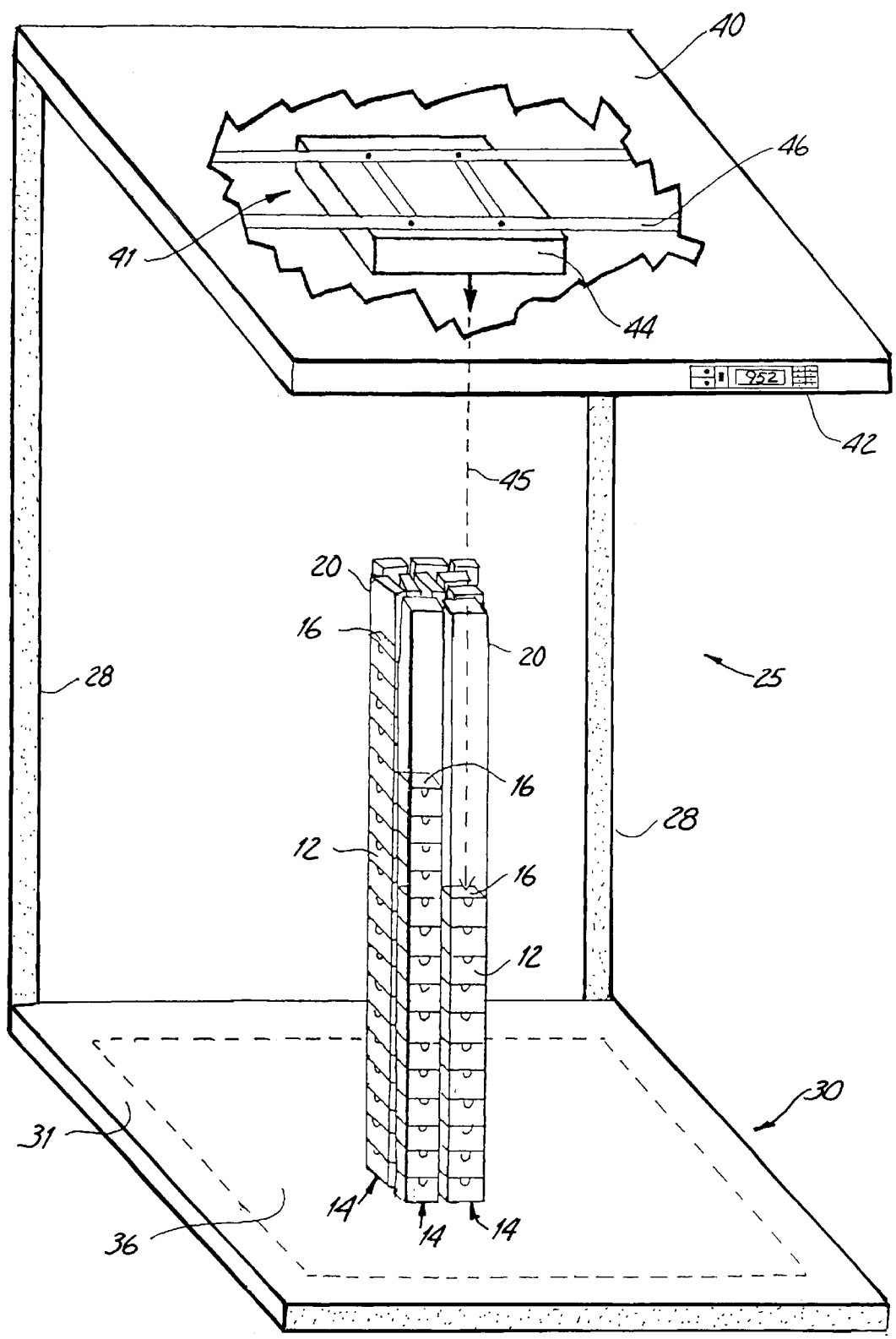
FIG. 3 shows a perspective view of one embodiment of a counting apparatus of the present invention.
Figure 4A:
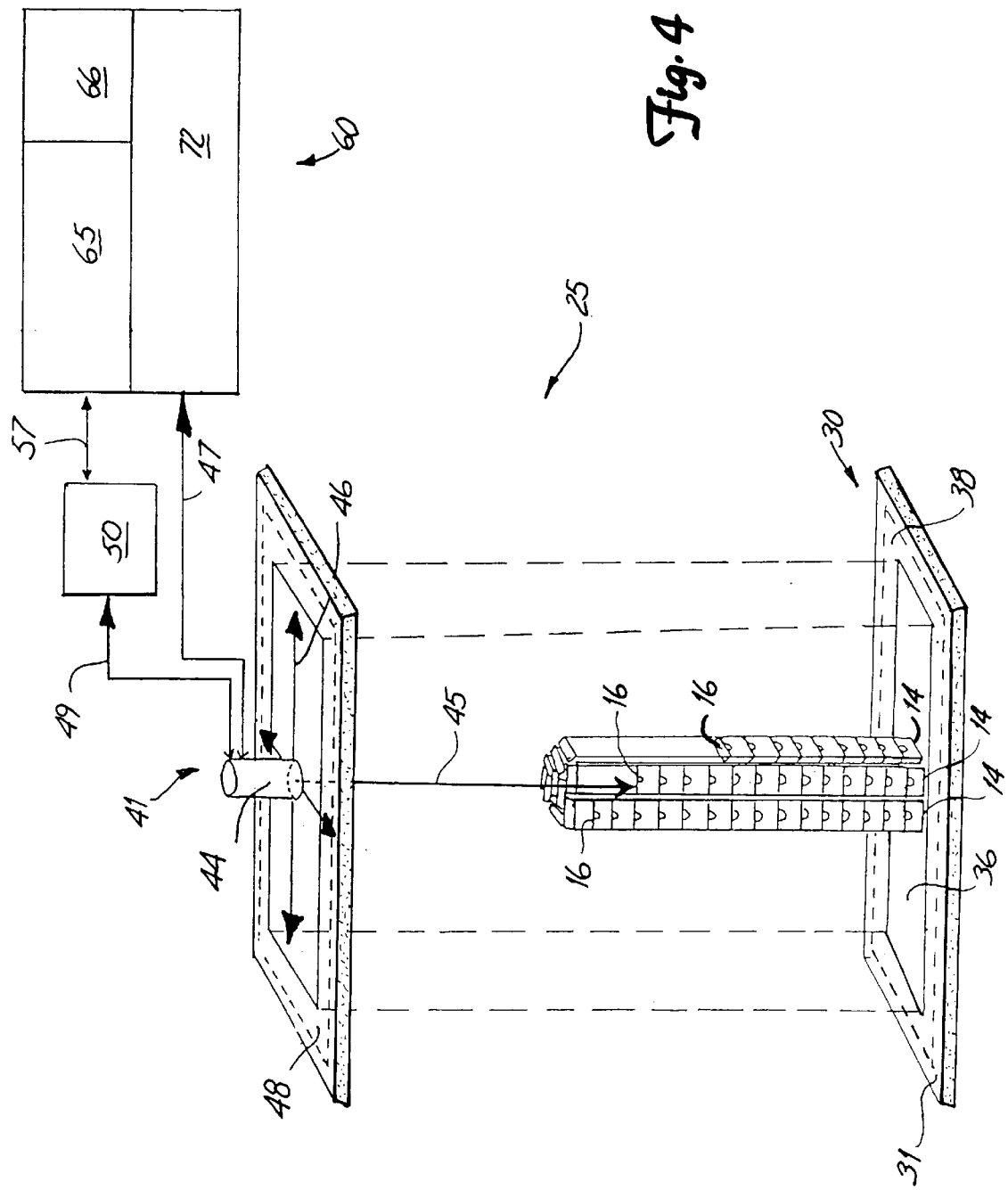
FIG. 4A is a schematic diagram of one embodiment of a counting apparatus of the present invention.
Figure 4B:
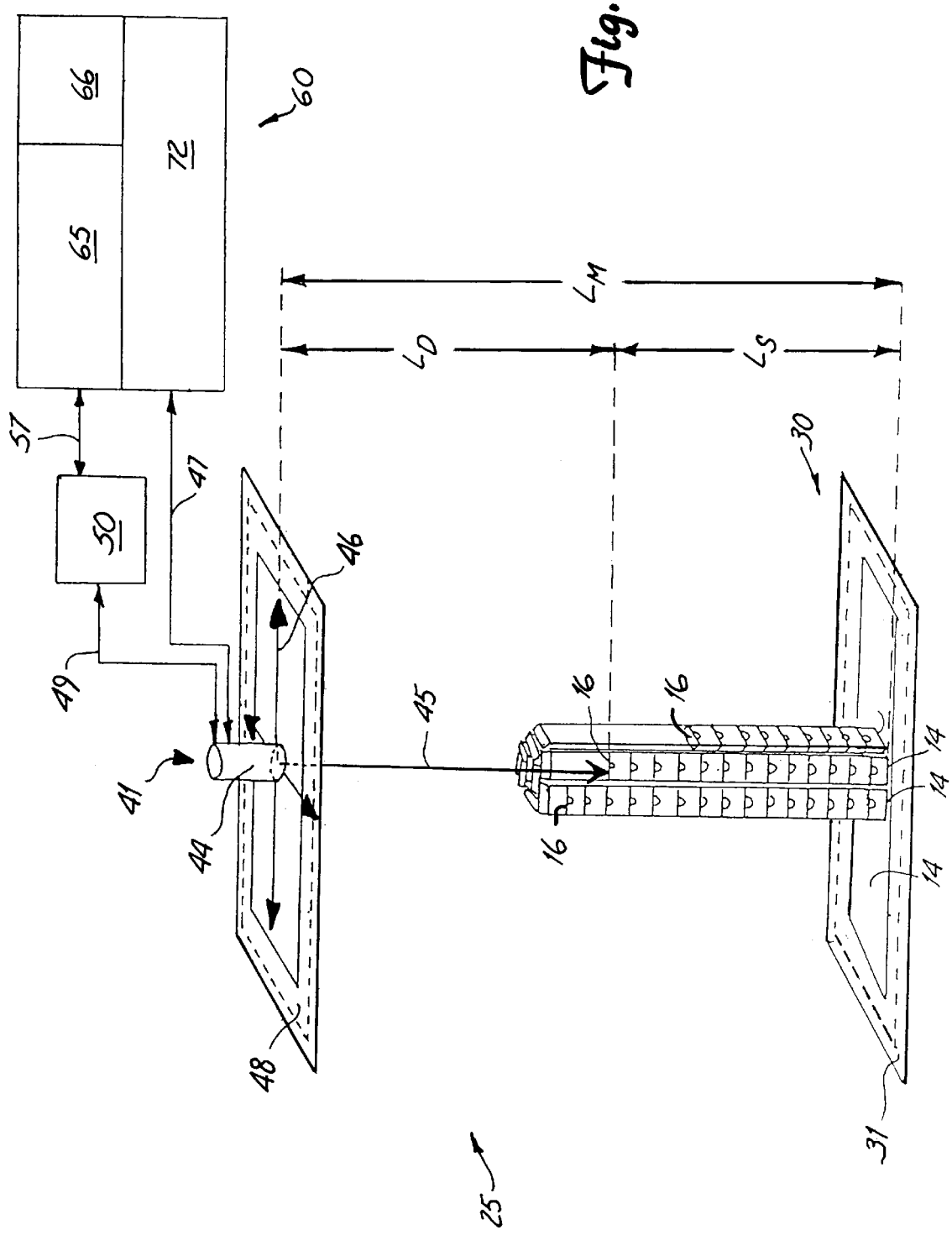
FIG. 4B is a schematic diagram of the counting apparatus of FIG. 4A showing various length dimensions.

With reference to FIGS. 3, 4A, and 4B, there is shown an apparatus 25 for counting chips 2 that are arranged into linear chip sequences 12. Apparatus 25 comprises a scan station 30 and a sensor scan module 40 that is mounted to and supported above scan station 30 through support members 28. The sensor scan module 40 counts chips 2 in chip sequences 12, which are placed in a bundle of tubes 20 at scan station 30.

In one embodiment, scan station 30 includes a platform 31, which has a defined scan zone 36. Platform 31 receives shipping tubes 20 which house chip sequences 12 in the depicted embodiment. The shipping tubes 20 are positioned vertically within the scan zone 36 so that the chips 2 may be counted. The first ends 14 of chip sequences 12 are adjacent to the end wall 23 resting on platform 31, which functions as a reference plane for measuring the lengths $L_S$ of the chip sequences 12. In the depicted embodiment, chip sequences 12 are substantially parallel with one another and are substantially perpendicularly aligned relative to a measurement plane 48, which will be addressed in greater detail below.

Scan module 40 includes distance sensor assembly 41, input/display panel 42, and processor system 60 (not shown in FIG. 3). Responsive to processor system 60, sensor assembly 41 scans the scan zone 36 to provide processor system 60 with discrete distance measurements at locations in their scan zone 36. In turn, processor system 60 processes this information to determine the number of chips 2 included in the chip sequences 12 positioned in scan zone 36. This number is then displayed by input/display panel 42, which may be any suitable mechanism, (e.g., a key pad with an LCD panel), for inputting data into processor system 60 and for displaying count results, as well as other pertinent data.

5.2.1 Sensor Assembly

With reference to FIGS. 4A and 4B, the sensor assembly 41 includes a distance sensor 44, a sensor transport mechanism 46, and a sensor controller 50. The distance sensor 44 is mounted to sensor transport mechanism 46, which moves distance sensor 44 in (i.e., within or parallel to) a measurement plane 48. Sensor transport mechanism 46 provides this planar motion in response to control signals from sensor controller 50 via control lines 49. For overall control and processing of sensor assembly 41 and processing of sensed measurement data from distance sensor 44, both the distance sensor 44 and the sensor controller 50 are operably connected to processor system 60 through a sensor line(s) 47 and a controller bus 57, respectively.

Distance sensor 44 may be any distance sensor that has sufficient range and resolution capabilities for measuring distances to objects measured from measurement plane 48 pursuant to embodiments of the present invention. For example, distance sensor 44 could be a point laser sensor (e.g., a DynaVision™ S Series SPR-02 laser sensor, available from Dynamic Control Systems of Delta, British Columbia, Canada), which uses triangulation to measure the distance to a target point. However, other sensors utilizing a variety of sensing or detecting techniques (e.g., ultrasonic) may be used. In general, a beam 45 is directed downward onto a discrete location, which has an associated coordinate, within the scan zone 36. In turn, a return beam(s) (not shown) is reflected from an object at that location back into the distance sensor 44, which determines the measured distance $L_D$ to the object. The distance sensor 44 outputs a digital signal conveying the sensed distance through signal bus 47 to the processor system 60. By scanning the scan zone 36, distance sensor 44 produces a distance signal map that includes distance measurements for multiple discrete points within the scan zone 36.

Sensor transport mechanism 46 generally comprises a conventional X-Y mechanical transport structure that encompasses the area over scan zone 36 for controllably transporting distance sensor 44 in a measurement plane 48. The distance sensor 44 may be moved by the sensor transport mechanism 46 to scan the surface of the scanning zone 36 via control signals sent by the sensor controller 50 to the sensor transport mechanism 46, which is operably connected to distance sensor 44. Among other things, sensor transport mechanism 46 may include motors and linkages (not shown) for driving the distance sensor 44 in multiple directions and sensors for providing sensor controller 50 with feedback (e.g., direction, rate) in order to implement, for example, a servo scanning system. The sensor transport mechanism 46 may be selected to be optimally fast in connection with the electronic and mechanical limitations of distance sensor 44. The practical scan resolution will depend upon the speed of the sensor transport mechanism 46.

In one embodiment, processor system 60 comprises a scan zone memory map 65, processing software 66, and a processor 72. Processor 72 executes processing software 66 to control scanning by distance sensor 44 and to process distance measurement data, which it receives from distance sensor 44, to count the number of chips 2 in tubes 20 that are within the scan zone 36. Processor 72 communicates with sensor controller 50 to control sensor transport mechanism 46 in order to direct the scanning motion of distance sensor 44. In addition, processor 72 communicates with distance sensor 44 to transmit and receive sensor control and distance measurement signals respectively, via sensor line(s) 47 and sensor controller 50. These signals may be a combination of digital and analog signals that are conveyed with serial and/or parallel means. In this manner, processor 72 is able to synchronize distance measurement data from distance sensor 44 with its mechanical scanning rate. Distance measurements from discrete locations, i.e. points, of scan zone 36 are mapped into scan zone memory map 65, which has addressable memory locations that correspond to the discrete location coordinates of scan zone 36. Once the scan zone 36 is mapped or alternatively, as it is being mapped, processor 72 processes the distance measurement data to count the total number of chips 2 that are contained within the scan zone 36.

Conventional devices may be used to implement processor 72, sensor controller 50, and scan zone memory map 65. For example, sensor controller 50 could be implemented with a standard servo controller operably connected to sensor transport mechanism 46 for controlling the planar motion of distance sensor 44 within a servo control system. In this manner, processor 72 can control the scanning of distance sensor 44 by simply providing sensor controller 50 with scanning commands, e.g., scan rate and position commands. In addition, processor 72 may be any suitable processing device. It could include, but not be limited to, a microprocessor, a microcontroller, or a computer.

5.2.2 Scan Station

With reference to FIGS. 4A, 4B, 5A and 5B, scan station 30 includes platform 31, which receives tubes 20 containing chip sequences 12 for counting and which may be substantially parallel to measurement plane 48. In the depicted embodiment, platform 31 also serves as a reference plane 38 for measuring the lengths $L_S$ of chip sequences 12. In addition, scan station 30 has a scan zone 36, which defines the topographical area to be scanned by distance sensor 44. Thus, with the depicted embodiment, not only should the chip sequences 12 be perpendicularly oriented relative to measurement plane 48 so that the beam 45 from distance sensor 44 can strike the second sides 16 of chip sequences 12 to measure their lengths $L_S$, but also, chip sequences 12 to be measured should be sufficiently enclosed within scan zone 36.

Figure 5A:
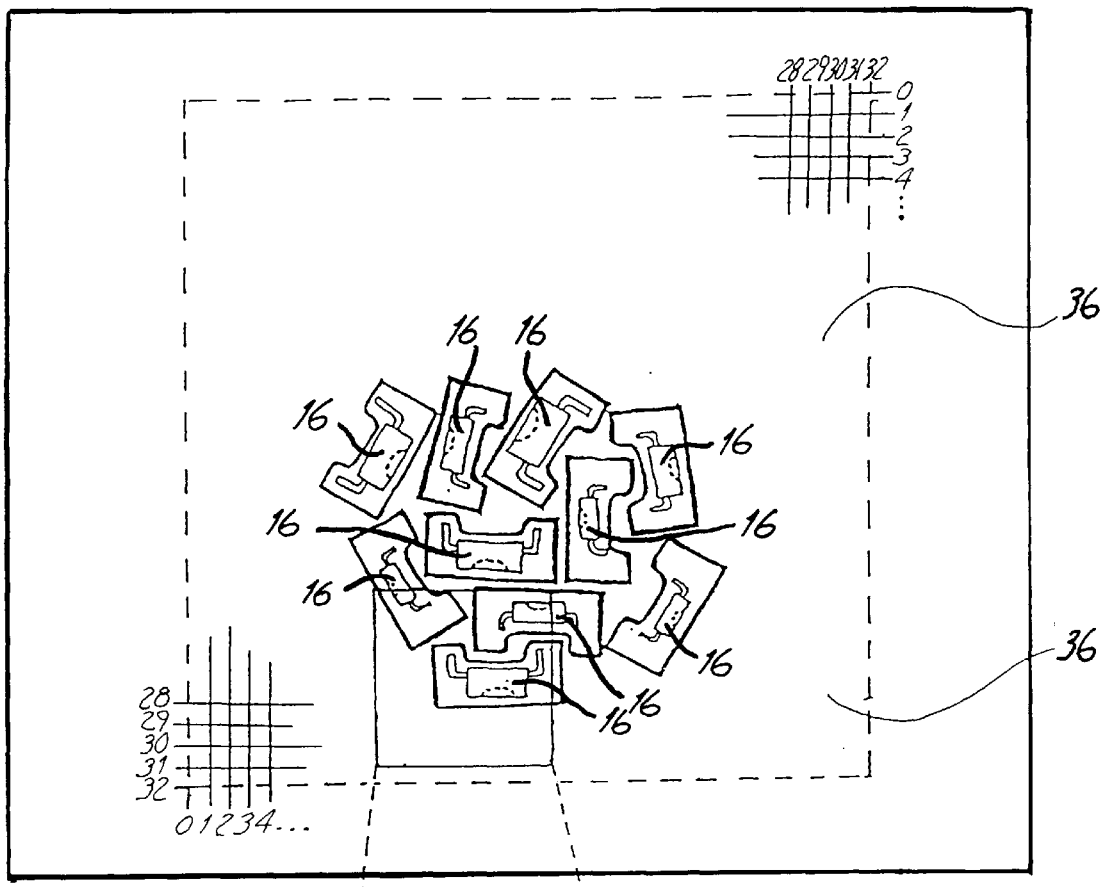
FIGS. 5A and 5B show an embodiment of a surface grid of a scanning zone for a counting apparatus of the present invention.
Figure 5B:
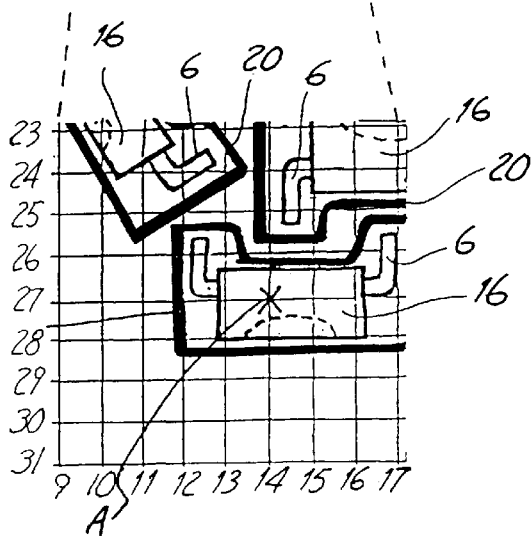

As shown in FIGS. 5A and 5B, the topographical scanning surface from scan zone 36 may have coordinates that map discrete locations (or "points") on this surface. These coordinates correspond to specific memory locations within scan zone memory map 65. As distance sensor 44 scans the scan zone 36, distance measurements for each discrete location are stored in their corresponding memory location of scan zone memory map 65. This enables processor 72 to process the distance measurement data in order to determine the number of chips 2 in the chip sequences 12 from their lengths $L_S$.

The scan zone coordinates correspond to the scan pattern that is utilized by distance sensor 44. For example, in the depicted embodiment, a top to bottom sweep pattern, which is analogous to a television's sweep pattern, is used. Thus, a rectangularly shaped cross-section has been selected for scan zone 36 in the depicted embodiment. In turn, row/column coordinates are used to map the scan zone 36. The scan zone of FIG. 5 has a 33×33 grid with 1089 distinct distance measurement points.

Persons of ordinary skill will recognize that other suitable sweep patterns could be implemented. For example, a spiraling or circular sweep pattern may be used. With such a pattern, polar coordinates could map the distance measurements onto a circular or elliptical grid. Such a pattern could improve scan efficiency in certain environments, e.g., when object (or chip) sequence groups to be counted have a substantially circular cross-section and are positioned within the center of the scan zone 36.

The resolution of the scan pattern should be high enough to ensure that a sufficient number of distance measurements are taken from each second side 16 of the chip sequences 12. In the depicted embodiment of FIGS. 5A and 5B, the distance between scan rows and scan columns was selected to be slightly less than one half of the smallest dimension of a chip sequence's second side 16, which in this embodiment is slightly less than one half of a chip body's thickness T. In this embodiment, the width W of a second side 16 is about one and one half times the thickness T. Thus, with this embodiment, at least six measurement points should be taken from each second side 16. The number of necessary measurement points will depend upon the particular type of processing scheme that is implemented for determining the lengths of each chip sequence 12.

5.3 Chip Counting

With reference again to FIGS. 4A–5B, chip counting apparatus 25 counts chips 2 within linear chip sequences 12 by (1) measuring the lengths of the chip sequences 12 and (2) determining the number of chips in the chip sequences from these measured lengths. Because the length of a chip sequence 12 is proportional to the number of chips 2 contained in the sequence, the number of chips 2 in the sequence can be derived by dividing the sequence length $L_S$ by the length $L_C$ of a chip within the chip sequence 12. Thus, the total number of chips 2 in a bundle of several chip sequences 12 can be determined by counting the number of chips 2 in each sequence from its measured length and then summing the individual counts to calculate the total number of chips 2 that have been positioned within the scan zone 36.

5.3.1 Measuring Chip Sequence Lengths

In one embodiment, chip sequences 12 are positioned within the scan zone 36 and are oriented substantially perpendicular to the measurement plane 48 and with their first ends 14 being adjacent to the reference plane 38. With the length $L_M$ between measurement plane 48 and reference plane 38 being known (e.g., through a calibration measurement), the length $L_S$ of a chip sequence 12 may be derived by subtracting the distance $L_D$ between the measurement plane 48 and its second side 16 from known length $L_M$. Thus, processor 72 can determine each chip sequence length by measuring the distances between the measurement plane 48 and each of the second sides 16 of the chip sequences 12. In the depicted embodiment, distance sensor 44 emits its beam 45 from measurement plane 48. However, measurement plane 48 could alternatively be defined to be above or below distance sensor 44, depending upon how distance sensor 44 is set up, as well as how processor 72 is programmed to interpret the distance measurement data received from distance sensor 44.

In one embodiment, processor 72 measures the distances $L_D$ between measurement plane 48 and the second ends 16 in the following manner. Distance sensor 44 scans the scan zone 36 to measure the distances from measurement plane 48 to discrete locations on the surface of scan zone 36. As the distance sensor 44 is scanned over the scan zone 36, the distance measurements are mapped into scan zone memory map 65, with each location measurement being identifiable by its coordinate (e.g., 27, 14, which is referenced as A in FIG. 5B). With the row/column grid of FIGS. 5A and 5B, the intersection of a row and a column corresponds to a location on the scan zone 36 where a distance measurement is obtained and recorded into scan zone memory map 65. Finally, processor 72 processes the distance measurements to identify each individual linear chip sequence 12 and then to obtain its distance $L_D$, once the distance measurements corresponding to the second sides 16 have been identified.

In one embodiment, chip sequences 12 may be identified by (1) identifying as potentially valid distance measurements those measurements that fall within a predefined potential distance range, (2) grouping together into separate groups distance measurements that are sufficiently equal to one another, and (3) analyzing the coordinates of the measurements in each group to identify coordinate patterns that comply with predefined criterion for the second sides 16 of the chip sequences 12.

Potentially valid distance measurements are identified in order to discard the other measurements that cannot correspond to chip sequence second sides 16. For example, many measurements that correspond to points on platform 31 where no chip sequences 12 exist will be equivalent to $L_M$, the distance between measurement plane 48 and reference plane 38. Thus, valid second side measurements should be less than $L_M$–$L_C$+D. This value corresponds to the largest possible potentially valid measurement, which would be the measurement of a point on the deepest portion of recessed portion 8 from a chip sequence 12 that includes only one chip 2. Assuming that chip sequences 12 cannot be as long as the lengths of the shipping tubes 20, other measurements that could be discarded would include measurements that are less than or equal to $L_M$—the length of a shipping tube 20. In addition, with a sufficiently precise distance sensor 44, measurements that are not sufficiently close to a multiple of $L_C$ may also be discarded as not being potentially valid distance measurements. That is, a potentially valid distance measurement should be between $N \cdot L_C$ and $N \cdot L_C - D$.

Once potentially valid distance measurements have been identified as such, adjacent measurements can be grouped into separate groups of sufficiently equal distance measurements. This is done because measurements that correspond to a chip sequence second side 16 will be substantially equal to one another within a tolerance of D. The coordinates within each group can then be analyzed to identify the individual chip sequences 12.

Various criteria may be used in analyzing the coordinates (i.e., the locations of the potentially valid measurements) within the separate groups. For example, coordinates for a given second side 16 will all be sufficiently proximate to (i.e., adjacent to) one another. In addition, the shape of their pattern will conform to (or be consistent with) the shape of a second side 16. That is, coordinates that are identified as the coordinates of a second side 16 will have to fit within the geometrical shape of the second side 16. In addition, by knowing the minimum and maximum number of points that may be measured for each second side 16, groups having too few coordinates can be discarded, and predictions can be made as to the number of chip sequences expected to be identified in the group. In addition, conventional image processing techniques (e.g., object recognition principles such as those disclosed in U.S. Pat. Nos. 5,533,177 entitled METHOD FOR DETECTING AND ESTIMATING THE SPACIAL POSITION OF OBJECTS FROM A TWO-DIMENSIONAL IMAGE or 5,263,098 entitled OBJECT RECOGNITION METHOD AND APPARATUS FOR DETERMINING THE PRESENCE AND SHAPE OF AN OBJECT, which are hereby incorporated by reference into this disclosure) may be incorporated for identifying the linear chip sequences 12 including their locations.

Once the chip sequences 12 have been identified, their lengths $L_S$ may be determined. By having the coordinates that correspond to the various chip sequences 12, processor 72 can simply extract a smallest distance measurement from a chip sequence coordinate set to derive the distance $L_D$ from the measurement plane 48 to its second side 16. Once this distance $L_D$ for each chip sequence has been determined, the chip sequence lengths $L_S$ can be derived by subtracting the distances $L_D$ from the measurement reference plane distance $L_M$.

5.3.2 Determining Chip Counts

The total number of chips within chip sequences 12 may be determined by adding together the individual numbers of chips in each chip sequence 12. In one embodiment, the individual chip sequence counts are determined by dividing their lengths $L_S$ by the known, predetermined length of a chip $L_C$. After adding together the individual chip sequence counts, the processor 72 can then display this value on input/display panel 42. Depending on the dimensions and type of the chips to be counted, a user can enter chip specific parameters (e.g., the length value $L_C$) or identifiers into processor 72 via input/display panel 42.

5.4 Other Embodiments

It will be seen by those skilled in the art that various changes may be made without departing from the spirit and scope of the invention. For example, distance sensor 44 may remain stationary with one or more light reflecting or re-directing surfaces, such as mirrors utilized to direct the distance sensors's beam 45 onto the scan zone 36. This type of distance sensor could be implemented, for example, with a line scanner, such as a DynaVision™ L1 3D Scanner, available from Dynamic Control Systems. In addition, the individual chip sequences 12 could be identified and located with a separate sensor such as a pressure responsive pad. With the locations of the chip sequences 12, processor 72 could then measure their lengths by measuring distances of specific points that are known to correspond to their locations. Other embodiments will be recognized by persons of ordinary skill in the art.

Accordingly, the invention is not limited to what is shown in the drawings and described in the specification but only as indicated in the appended claims.

What is claimed is:

1. A method for counting the number of objects in two or more object sequences, each object sequence having a length that is proportional to the number of objects in the object sequence, and each object sequence having a first end and a second end, the method comprising:

positioning the object sequences substantially perpendicular to a scan zone plane, such that the first end of each object sequence is aligned at the scan zone plane;

(a) measuring the distance from the second end of each of the two or more object sequences to the scan zone plane; and (b) determining from the distances so measured, the number of objects that are present in the two or more object sequences.

2. The method of claim 1, wherein the scan zone plane has coordinates and the second ends of the object sequences form a scan zone surface, and wherein the act of measuring the distance from the second ends of two or more object sequences to the scan zone plane includes:

measuring the distance to the scan zone surface at a plurality of coordinates;

grouping the coordinates according to the measured distance; and determining which groupings of coordinates identify object sequences.

3. The method of claim 1 wherein the act of measuring the distance comprises the act of measuring said distance with a distance sensor.

4. The method of claim 1 further comprising the act of housing each object sequence in a linear container having a longitudinal axis that is aligned with the length of the object sequence.

5. The method of claim 4, wherein the act of housing the object sequence in a container includes the act of storing an integrated circuit chip sequence in a shipping tube.

6. The method of claim 5, wherein the object(s) within the object sequence are substantially equal in length with one another.

7. The method of claim 1, wherein the act of determining the number of objects includes dividing the length of the object sequences by an object constant that corresponds to the length of an object from the object sequences.

8. A method for counting the number of objects in a plurality of linear object sequences that each have (i) at least one object and (ii) a length that is proportional to the number of objects in the object sequence, wherein the object sequences have a first end and a second end, the method comprising:

(a) measuring the lengths of the object sequences by;

(i) positioning each object sequence between a reference plane and a measurement plane with its first end being substantially adjacent to the reference plane and its object sequence length oriented substantially perpendicular to the measurement plane; and (ii) measuring the distances between the second end of each object sequence and the measurement plane; and (b) determining the number of objects in the plurality of object sequences from the measured lengths of the object sequences.

9. The method of claim 8, wherein the act of measuring the distances between the second end of each object sequence and the measurement plane includes the act of measuring said distances with a distance sensor.

10. The method of claim 9, wherein (i) each object sequence is positioned within a scan zone having coordinates and (ii) the act of measuring said distances with a distance sensor includes the act of measuring said distances with a distance sensor that is movable in a plane for scanning the scan zone.

11. The method of claim 10 wherein the act of measuring said distances further comprises:
(i) scanning the scan zone with the distance sensor to obtain scanned distance measurements from the measurement plane to discrete locations on the scan zone,
(ii) mapping the scanned distance measurements into their corresponding scan zone coordinates, and
(ii) processing the scanned distance measurements to identify each object sequence and obtain the measured distance between its second end and the measurement plane.

12. The method of claim 11, wherein the act of measuring said distances further comprises the act of deriving said distances from the identified distance measurements that correspond to the second end of each object sequence.

13. The method of claim 12, wherein the act of processing the scanned distance measurements to identify each object sequence includes:
(i) identifying potentially valid distance measurements, wherein potentially valid distance measurements are distance measurements that fall within a potentially valid distance measurement range,
(ii) grouping together into separate groups those potentially valid distance measurements that are sufficiently equivalent to one another, wherein each group has group coordinates that correspond to the coordinates of the potentially valid distance measurements that are in the group, and
(iii) analyzing the group coordinates to identify each object sequence.

14. The method of claim 13 further comprising the act of housing each object sequence in a linear container having a longitudinal axis that is aligned with the length of the object sequence.

15. The method of claim 14, wherein the act of housing each object sequence in a container includes the act of storing one or more integrated circuit chips in a shipping tube.

16. The method of claim 15, wherein the chip(s) within each chip sequence are substantially equal in length with one another.

17. An object counting apparatus for counting the number of objects in a plurality of object sequences, wherein each object sequence has a first end and a second end the apparatus comprising:
(a) a scan zone to receive the object sequences such that the second ends of the object sequences comprises a scan zone surface, wherein the scan zone has coordinates;

(b) a distance sensor assembly operably aligned with the scan zone for measuring the lengths of the object sequences by;
(i) sensing the distance to the scan zone surface at a plurality of scan zone coordinates;
(ii) identifying each distance with a scan zone coordinate; and
(iii) identifying the object sequences by analyzing the scan zone coordinates; and (c) a processor communicatively connected to the distance sensor to determine the number of objects within the object sequences from the measured lengths of the object sequences.

18. The apparatus of claim 17, wherein the scan zone has a reference plane that is adjacent to a first end of the object sequences.

19. The apparatus of claim 18 further comprising a measurement plane, wherein the distance sensor assembly is aligned with said measurement plane to measure the distance from the measurement plane to the scan zone surface pursuant to measuring the lengths of the object sequences.

20. The apparatus of claim 19, wherein the measurement plane is oriented to be substantially perpendicular with said object sequences.

21. The apparatus of claim 20, wherein the object sequences are chip sequences.

22. The apparatus of claim 21 wherein the distance sensor assembly comprises a laser sensor.

23. The apparatus of claim 21, wherein the distance sensor assembly comprises a point distance sensor.

24. The apparatus of claim 21, wherein the distance sensor assembly is operably mounted to a sensor transport mechanism that controllably moves the distance sensor assembly substantially in the measurement plane for scanning the scan zone.

25. The apparatus of claim 24, further comprising software having instructions, wherein the instructions cause the processor to:
(i) identify potentially valid distance measurements, wherein potentially valid distance measurements are distance measurements that fall within a potentially valid distance measurement range, and
(ii) group together into separate groups those potentially valid distance measurements that are sufficiently equal to one another.

26. The apparatus of claim 24, wherein the scan zone is a rectangular grid with row/column coordinates that correspond to discrete locations on the scan zone where distances are measured from the measurement plane.

27. A method for counting the number of objects in a plurality of object sequences, wherein each object sequence has a first end and a second end, comprising:
defining a measurement plane;
defining a scan zone having coordinates;
defining at least one criterion for identifying an object sequence;
positioning the object sequences such that the second end of each object sequence defines the scan zone surface;
measuring the distance between the measurement plane and the scan zone surface at a plurality of coordinates and identifying each measured distance with a coordinate;
grouping coordinates having sufficiently equal measured distances identified therewith;

analyzing the coordinates of each coordinate grouping to identify coordinate patterns that comply with the defined criterion for identifying an object sequence; and calculating the lengths of the identified object sequences.

28. The method of claim 27, further comprising determining the number of objects from the calculated lengths of the object sequences.

29. The method of claim 27, wherein the act of measuring comprises the act of measuring with a distance sensor.

30. The method of claim 27, wherein the act of analyzing comprises determining whether coordinates within a coordinate grouping are sufficiently proximate to one another.

31. The method of claim 27, wherein the act of analyzing comprises analyzing coordinate patterns.

32. The method of claim 27, wherein the act of analyzing comprises discarding coordinate groupings having too few coordinates.

* * * * *